(12) United States Patent
Jeon et al.

(10) Patent No.: US 9,037,946 B2
(45) Date of Patent: May 19, 2015

(54) DETECTING EFFECT OF CORRUPTING EVENT ON PRELOADED DATA IN NON-VOLATILE MEMORY

(71) Applicant: SANDISK TECHNOLOGIES INC., Plano, TX (US)

(72) Inventors: Seungjune Jeon, Milpitas, CA (US); Idan Alrod, Herzliya (IL); Qing Li, Milpitas, CA (US); Xiaoyu Yang, Milpitas, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 113 days.

(21) Appl. No.: 13/796,841

(22) Filed: Mar. 12, 2013

(65) Prior Publication Data

US 2014/0281750 A1 Sep. 18, 2014

(51) Int. Cl.
*G11C 29/00* (2006.01)
*G11C 29/50* (2006.01)
*G11C 16/34* (2006.01)
*G06F 11/10* (2006.01)
*G11C 29/02* (2006.01)

(52) U.S. Cl.
CPC ...... *G11C 29/50004* (2013.01); *G11C 16/3404* (2013.01); *G06F 11/1068* (2013.01); *G11C 2029/5004* (2013.01); *G11C 16/3418* (2013.01); *G11C 16/349* (2013.01); *G11C 29/021* (2013.01); *G11C 29/028* (2013.01)

(58) Field of Classification Search
CPC .................. G11C 29/50004; G11C 16/3404; G11C 16/32; G06F 11/1068

USPC ......... 714/721, 746, 763; 365/185.02–185.05
See application file for complete search history.

(56) References Cited

U.S. PATENT DOCUMENTS

| | | | |
|---|---|---|---|
| 8,001,441 B2 * | 8/2011 | Brandman ..................... 714/763 |
| 8,458,563 B2 * | 6/2013 | Sharon et al. ................. 714/763 |
| 8,711,619 B2 * | 4/2014 | Patapoutian et al. .... 365/185.03 |
| 2005/0083726 A1 | 4/2005 | Auclair et al. |
| 2010/0169547 A1 | 7/2010 | Ou |
| 2011/0075482 A1 | 3/2011 | Shepard et al. |
| 2011/0107049 A1 | 5/2011 | Kwon et al. |
| 2011/0199823 A1 | 8/2011 | Bar-Or et al. |

OTHER PUBLICATIONS

Cai et al./, Error patterns in MLC NAND flash memory: measurement, characterization, and analysis, 2012, IEEE, p. 1-6.*
Zhou et al., Error-correcting schemes with dynamic thresholds in Nonvolatile memories, 2011, IEEE, p. 2143-2147.*
International Search Report and Written Opinion mailed Nov. 21, 2014 in International Application No. PCT/US2014/020768, 18 pages.

(Continued)

*Primary Examiner* — Shelly A Chase
(74) *Attorney, Agent, or Firm* — Toler Law Group, PC

(57) ABSTRACT

A method includes determining a read threshold voltage corresponding to a group of storage elements in a non-volatile memory of a data storage device. The method also includes determining an error metric corresponding to data read from the group of storage elements using the read threshold voltage. The method includes comparing the read threshold voltage and the error metric to one or more criteria corresponding to a corrupting event.

22 Claims, 3 Drawing Sheets

(56) References Cited

OTHER PUBLICATIONS

Invitation to Pay Additional Fees, And, Where Applicable, Protest Fee and Partial International Search Report mailed Sep. 2, 2014 in International Application No. PCT/US2014/020768, 7 pages.

Non-Final Office Action mailed Aug. 28, 2014 in U.S. Appl. No. 14/286,571, 7 pages.

Jung et al., "Modeling of Vth Shift in NAND Flash-Memory Cell Device Considering Crosstalk and Short-Channel Effects", IEEE Transactions on Electron Devices, vol. 55, No. 4, Apr. 2008, 7 pages.

* cited by examiner

__US 9,037,946 B2__

DETECTING EFFECT OF CORRUPTING EVENT ON PRELOADED DATA IN NON-VOLATILE MEMORY

FIELD OF THE DISCLOSURE

The present disclosure is generally related to non-volatile memories.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase storage density of a memory device, a bit error rate of data stored at the memory device may also increase.

Data may be stored in a non-volatile memory device prior to the non-volatile memory device being coupled to a memory controller. Such "preloaded" data may be subject to one or more corrupting events that may cause errors to occur in the data. In some circumstances, a number of errors introduced in the preloaded data may exceed an error correction capability of an error correction coding (ECC) scheme used to protect the preloaded data. To illustrate, attaching a non-volatile memory device to a printed circuit board or controller die may include heating the non-volatile memory die, such as according to an infrared (IR) reflow process. Heating the non-volatile memory die may cause threshold voltage shifting of storage elements that store the preloaded data, causing errors in the preloaded data.

SUMMARY

An effect of a corrupting event on preloaded data is detected in a non-volatile memory. Storage elements containing preloaded data are read to determine one or more updated read threshold voltages and error metrics corresponding to a group of the storage elements. A result of a comparison operation using the updated read threshold voltage and the error metric indicates whether the preloaded data has been corrupted by the corrupting event.

DETAILED DESCRIPTION

Figure 1:
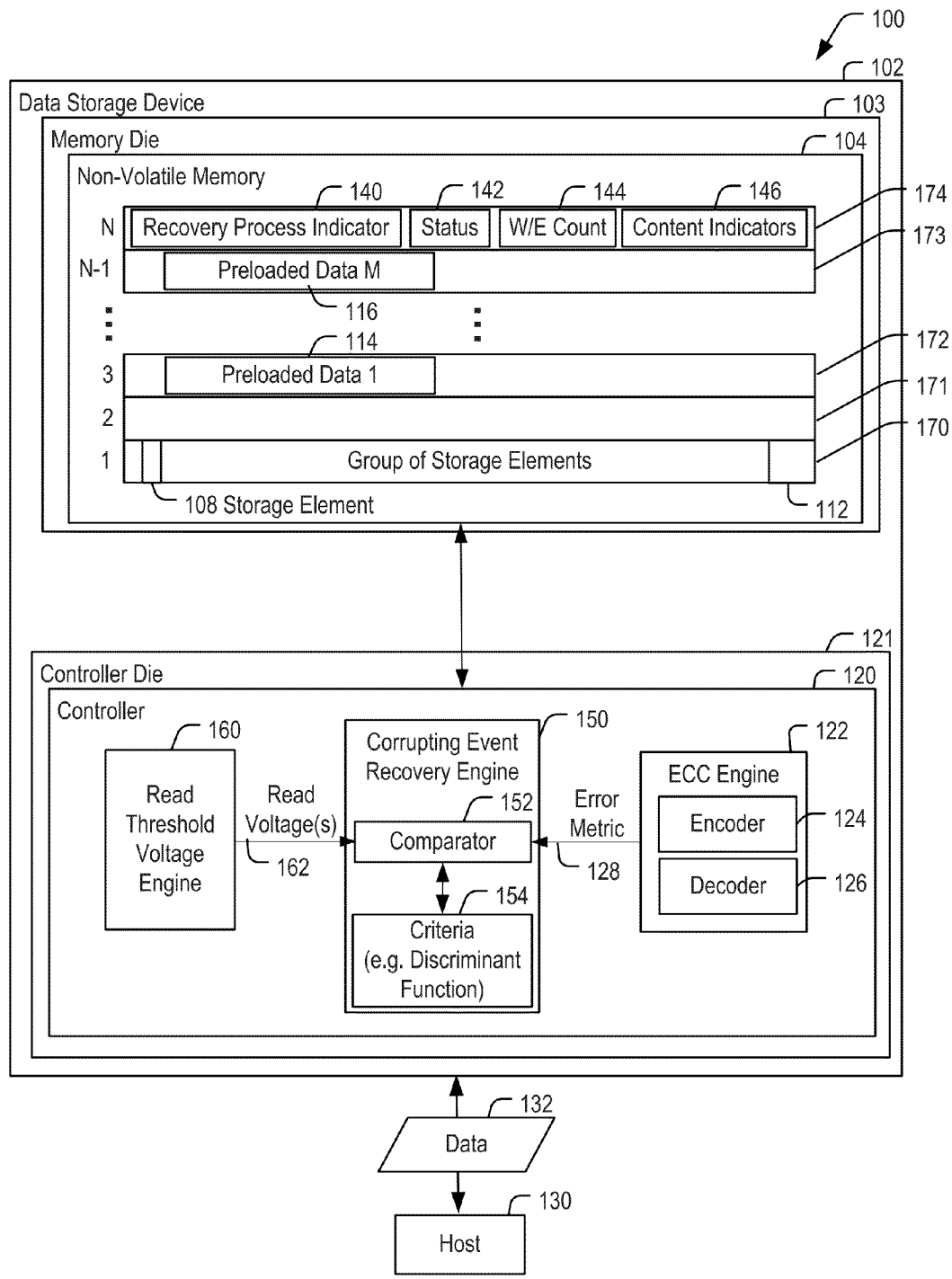
FIG. 1 is a block diagram of a first illustrative embodiment of a system including a data storage device that is operable to detect an effect of a corrupting event on preloaded data.

Referring to FIG. 1, a particular embodiment of a system 100 includes a data storage device 102 coupled to a host device 130. The data storage device 102 includes a controller 120 with a corrupting event recovery engine 150 that is configured to detect whether a non-volatile memory 104 has been subjected to a corrupting event based on characteristics of preloaded data stored in the non-volatile memory 104. A "corrupting event" may be any event that causes errors to occur in data stored in the non-volatile memory 104. An IR reflow process that causes errors to occur in preloaded data is an example of a corrupting event.

The host device 130 may be configured to provide data, such as the user data 132, to be stored at the non-volatile memory 104 or to request data to be read from the non-volatile memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the non-volatile memory 104 and writing to the non-volatile memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the non-volatile memory 104 in accordance with any other suitable communication protocol.

The data storage device 102 includes a memory die 103 that includes the non-volatile memory 104 and that is coupled to a controller die 121 that includes the controller 120. The non-volatile memory 104 may be a flash memory, such as a NAND flash memory. The non-volatile memory 104 includes multiple groups of storage elements, such as a first group 170, a second group 171, a third group 172, up to an N-1$^{st}$ group 173 and an N-th group 174. For example, each group 170-174 may be an error correction coding (ECC) page, a word line, an erase block, or another group of storage elements of a multi-level cell (MLC) flash memory.

The first group 170 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. The first group 170 may include a parity portion 112 that may correspond to one or more storage elements dedicated to storing ECC redundancy data/parity bits corresponding to data stored in the first group 170.

As illustrated, one or more of the groups 170-174 of storage elements may include preloaded data, such as first preloaded data 114 stored in the third group 172 and M-th preloaded data 116 stored in the N−$1^{st}$ group 173. The preloaded data 114, 116 may include data that is stored to the non-volatile memory 104 prior to the memory die 103 being coupled to the controller die 121. For example, a manufacturer of the memory die 103 may store the preloaded data 114, 116 in the non-volatile memory 104, and the data storage device 102 may be assembled later in a process that includes electrically coupling the memory die 103 to the controller die 121, such as via mechanically mounting the memory die onto a printed circuit board (PCB) using an IR reflow process, where the controller die 121 is also mechanically mounted on the same PCB.

The non-volatile memory 104 may include management data, such as a recovery process indicator 140, a recovery process status indicator 142, a write/erase count 144, and content indicators 146 that indicate groups of storage elements that include preloaded data. The management data 140-146 may be encoded into one or more ECC codewords. Alternatively or in addition, portions of the management data may be separately encoded. To illustrate, the recovery process indicator 140 may be encoded according to a repetition encoding scheme to enable relatively quick reading and decoding of the recovery process indicator 140 as compared to decoding an entire ECC page that includes the recovery process indicator 140.

The recovery processor indicator 140 may include one or more bits indicating whether a recovery process is complete. To illustrate, the recovery process may include reprogramming each of the groups 170-174 that store preloaded data, such as by reading preloaded data from the non-volatile memory 104, correcting bit errors in the preloaded data, and writing the error-corrected preloaded data to the non-volatile memory 104. For example, the recovery process indicator 140 may have an initial value indicating that a recovery process is not complete. In response to the controller 120 conducting and completing a recovery process, the recovery process indicator 140 may be set to have a second value indicating that the recovery process has been completed.

The recovery process status indicator 142 may indicate a status of a recovery process that may be at least partially completed. For example, the recovery process status indicator 142 may include an indicator or flag for each group of storage elements of the non-volatile memory 104. Each indicator or flag of the recovery process status indicator 142 may have a value that indicates whether a recovery process has been performed to detect and correct an effect of a corrupting event on a particular group of storage elements associated with the indicator. The write/erase count 144 may be used to track a number of write/erase cycles that have been performed at the non-volatile memory 104. The content indicators 146 may include a set of indicators that indicate which of the groups 170-174 store preloaded data. For example, the content indicators 146 may include one bit per group 170-174, and the value of the bit for a particular group indicates whether the particular group stores preloaded data. As another example, the content indicators 146 may include a list, table, or other data that identifies groups 170-174 that store preloaded data, such as by including one or more physical address or ranges of physical addresses.

The controller 120 is configured to receive data and instructions from and to send data to the host device 130 while the data storage device 102 is operatively coupled to the host device 130. The controller 120 is further configured to send data and commands to the non-volatile memory 104 and to receive data from the non-volatile memory 104. For example, the controller 120 is configured to send data and a write command to instruct the non-volatile memory 104 to store data to a specified address. As another example, the controller 120 is configured to send a read command to read data from a specified address of the non-volatile memory 104.

The controller 120 includes an ECC engine 122 that is configured to receive data to be stored to the non-volatile memory 104 and to generate a codeword. For example, the ECC engine 122 may include an encoder 124 configured to encode data using a first ECC scheme. For example, the encoder 124 may be a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof.

The ECC engine 122 also includes a decoder 126 configured to decode data read from the non-volatile memory 104. The decoder 126 is configured to detect and correct, up to an error correction capability of the first ECC scheme, bit errors that may be present in the data. The decoder 126 may be configurable to determine an estimate of a bit error rate of received data without performing a full decoding of the received data. For example, a syndrome weight (e.g., a number of unsatisfied parity check equations represented by a syndrome vector) may be used to estimate a bit error rate without performing a full decoding operation, such as in a sparse parity check matrix code (e.g., LDPC) implementation.

The controller 120 includes a read threshold voltage engine 160 that is configured to perform one or more sensing operations at the non-volatile memory 104 and to determine one or more read threshold voltages 162 corresponding to a selected group of storage elements. For example, the read threshold voltage engine 160 may be configured to perform a cell voltage distribution (CVD) process that includes sensing a group of storage elements at multiple read voltages to obtain a mapping or histogram of cell threshold voltage distributions. The read threshold voltage engine 160 may be configured to perform an analysis, such as to detect one or more minima, and to select one or more read threshold voltages that result in a reduced or minimal number of errors when data is read from the group of storage elements. For example, the one or more read threshold voltages may be selected to coincide with the detected minima.

As another example, the read threshold voltage engine 160 may be configured to perform a CVD process to individual logical pages read from a group of storage elements, rather than performing a full CVD process. For example, each storage element, such as the storage element 108, may store multiple bits of data corresponding to multiple logical pages. For example, the storage element 108 may be programmable to have a threshold voltage corresponding to one of four states: an erase (Er) state, state A, state B, or state C. Each state may correspond to a two-bit value, such as a "11" value for the erase state. A "lower" logical page may be read by sensing the storage elements using a read threshold voltage corresponding to the A-B state border, while an "upper" logical page may be read using read threshold voltages corresponding to the Er-A state border and to the B-C state border. A CVD process may be applied to the lower logical page to determine a read threshold voltage for the A-B state border that substantially reduces or minimizes errors in the upper logical page. A separate CVD process may be applied to the upper logical page to determine read threshold voltages for the Er-A and B-C borders that substantially reduce or minimize errors in the upper logical page.

As a third example, the read threshold voltage engine 160 may be configured to perform a dynamic read process that includes performing multiple reads of a group of storage elements at various read threshold values and to send the resulting sets of read data to the ECC engine 122 to identify a set of read threshold voltages determined to result in the fewest detected errors.

The corrupting event recovery engine 150 is configured to receive an error metric 128 from the ECC engine 122 and to receive one or more read voltages 162 from the read threshold voltage engine 160. The corrupting event recovery engine 150 may include a comparator 152 configured to compare the one or more read threshold voltages 162 and the error metric 128 to one or more criteria 154 corresponding to a corrupting event. For example, the criteria 154 may correspond to characteristics of data that has been corrupted by an infrared reflow process. As described in further detail with respect to FIG. 2, the criteria 154 may include a discriminant function.

During operation, the corrupting event recovery engine 150 may query a value of the recovery process indicator 140 in response to a power-up of the controller 120 to determine whether a recovery process should be performed. To illustrate, when the controller 120 detects the non-volatile memory 104 upon power-up, the controller 120 may not know whether this is the first time the controller 120 has detected the non-volatile memory 104 (e.g., a first power-up after an IR reflow that couples the controller die 121 to the memory die 103).

In a particular embodiment, the controller 120 may determine a value of the recovery process indicator 140 to determine whether a recovery process has been completed. For example, the recovery process indicator 140 may include a flag that is "off" (i.e., has a first value) until it is programmed to be "on" (i.e., to have a second value). Because it is possible that the recovery process indicator 140 itself is corrupted by a corrupting event, the read threshold voltage engine 160 may perform a threshold estimation process (such as CVD tracking, page-by-page CVD, Dynamic Read, or one or more other processes), of an ECC page of the N-th group 174, read a representation of a codeword from the ECC page of the N-th group 174 using the resulting read voltage(s) from the read threshold voltage engine 160, and decode the representation of the codeword using the decoder 126. Alternatively, or in addition to encoding the recovery process indicator 140 using an ECC encoding, a repetition code may be used to protect the recovery process indicator 140.

The corrupting event recovery engine 150 may operate according to a process that includes, upon a power-up event at the controller 120, determining a value of the recovery process indicator 140. If the recovery process indicator 140 has a value indicating that a recovery process is complete, the controller 120 may transition to a normal operation mode. Otherwise, the corrupting event recovery engine 150 may check whether or not a corrupting event has occurred.

For example, the corrupting event recovery engine 150 may cause the read threshold voltage engine 160 to perform a threshold estimation process on one or more of the groups 170-174 that store preloaded data. To illustrate, the corrupting event recovery engine 150 may access the preloaded content indicators 146 to identify a group of storage elements that stores preloaded data, such as the third group 172, and may send an indication of the third group 172 to the read threshold voltage engine 160 with a signal instructing the read threshold voltage engine 160 to determine one or more read threshold voltages for the third group 172.

Upon generation of the read threshold voltage(s) 162, the corrupting event recovery engine 150 may cause the identified group of storage elements (e.g., the third group 172) to be read using the generated read threshold voltage(s) 162 to obtain a representation of an ECC codeword corresponding to preloaded data (e.g., the first preloaded data 114). The representation of the ECC codeword may be provided to the ECC engine 122 and decoded at the decoder 126 to obtain a count of bit errors or a bit error rate (BER) of the representation of the ECC codeword. For example, a count of bit errors may be determined in implementations using BCH, Reed-Solomon, or LDPC codes. As another example, BER estimation (e.g., based on syndrome weight) may be used without decoding in implementations using sparse parity check matrix codes, such as LDPC codes. The count of bit errors or BER (estimated or actual) may be received at the corrupting event recovery engine 150 as the error metric 128.

The corrupting event recovery engine 150 may determine whether the read voltage(s) 162 and the error metric 128 satisfy the one or more criteria 154 corresponding to a corrupting event. For example, as explained in further detail with respect to FIG. 2, the comparator 152 may determine whether a data point (e.g., threshold voltage 162, error metric 128) is above or below (or in some cases, left or right of) a discriminant function associated with the corrupting event (e.g., IR reflow). If the data point is above the discriminant function (e.g., a value of the error metric 128 for a particular threshold voltage 162 is greater than a value of the discriminant function at the particular threshold voltage 162), the corrupting event (e.g., IR reflow) is detected.

If the corrupting event is determined to have not occurred, then the recovery process indicator 140 may be set and the controller 120 may enter a normal mode of operation. Otherwise, if the corrupting event is determined to have occurred, the corrupting event recovery engine 150 may determine how many groups of storage elements have been reprogrammed, such as by reading the recovery process status indicators 142. If all groups of storage elements that contain preloaded data (e.g., as indicated by the content indicators 146) have been reprogrammed, then the recovery process indicator 140 may be set and the controller 120 may enter a normal mode of operation.

If any preloaded content data has not been reprogrammed, then the controller 120 may enter a reprogramming/refresh mode such that all of the groups 170-174 that are identified as storing preloaded data that have not been reprogrammed are added to a reprogramming queue. The controller 120 may use available background processing cycles to perform reprogramming of the identified groups. The controller 120 may make other adjustments to expedite reprogramming of the identified groups, such as by extending a duration of a 'busy' indicator during communication with the host device 130 to obtain additional processing cycles that may be used for reprogramming the identified groups.

In some implementations, reprogramming the groups 170-174 that are identified as storing preloaded data includes performing read voltage threshold estimation using the read threshold voltage engine 160 for each group (e.g., each block) to be reprogrammed. Performing read voltage threshold estimation may enable recovery of data when too many errors are present in the data to be decoded by the ECC decoder 126 when the data is read using default read threshold voltages. However, because performing read threshold estimation may include performing multiple sensing operations for each state boundary, reprogramming latency may increase as compared to using default read threshold voltages.

Upon completion of reprogramming of each identified group, the recovery process status indicators 142 may be updated. After all preloaded content has been reprogrammed, the corrupting event recovery engine 150 may change a value of the recovery process indicator 140 and transition the controller 120 from the reprogramming/refresh mode to a normal operating mode.

In another embodiment, the corrupting event recovery engine 150 is configured to compare a value of the write/erase count 144 to a threshold value to determine whether to obtain the read voltage(s) 162 and the error metric 128. In this embodiment, the recovery process indicator 140 may be omitted, and instead the corrupting event recovery engine 150 may test for effects of the corrupting event each time the controller 120 is powered up until the write/erase count 144 is greater than or equal to the threshold value. The threshold value may be selected to be large enough to provide the corrupting event recovery engine 150 sufficient time to complete reprogramming of preloaded data and to be small enough to restrict an impact of other data corrupting effects, such as data retention effects. For example, an effect of data retention may be similar to an effect of IR reflow but may not be correctable via reprogramming. As an example, selecting a threshold value to be fifty write/erase cycles may provide sufficient time to enable completion of reprogramming while restricting impact of data retention effects.

Figure 2:
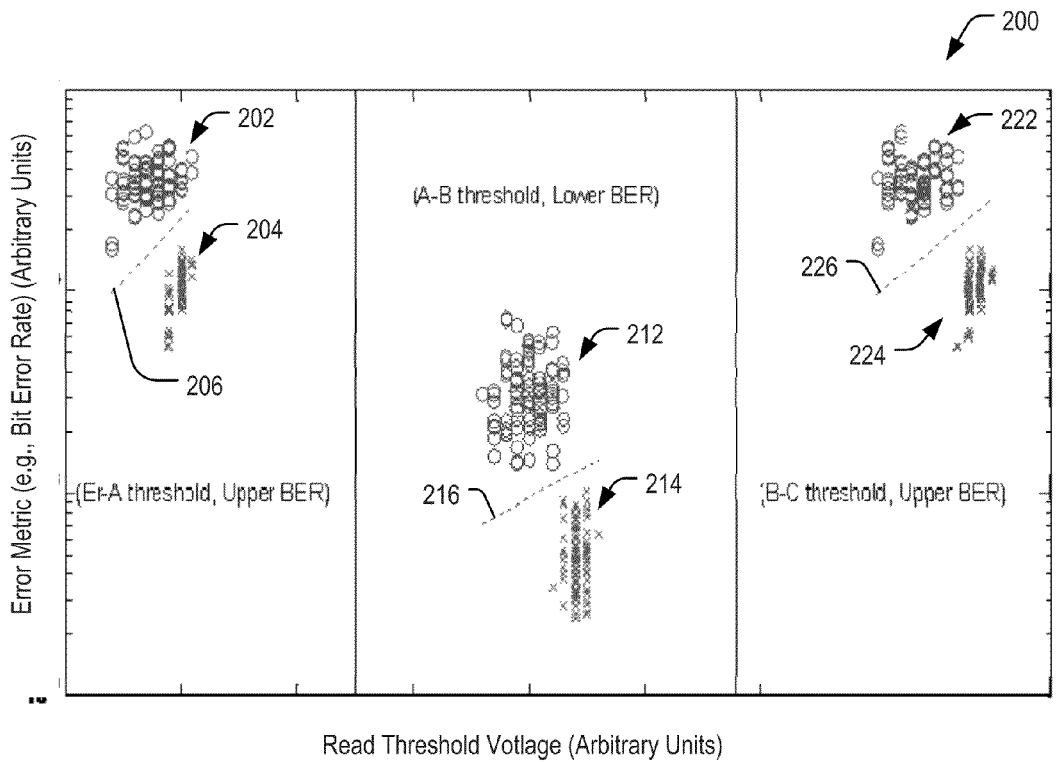
FIG. 2 is a diagram illustrating an example of relationships between read threshold voltages and error metrics corresponding to corrupted preloaded data and non-corrupted preloaded data.

FIG. 2 illustrates a particular embodiment of a graph 200 showing examples of using the read threshold voltage(s) 162 and the error metric 128 of FIG. 1 to detect an effect of a corrupting event, such as IR reflow. In FIG. 2, the horizontal axis corresponds to a read threshold voltage 162 determined for a particular group (illustrated in linear scale) and the vertical axis corresponds to a value of the error metric 128 (illustrated in log scale) for the particular group when read using the threshold voltage 162. Data points indicated as circles represent groups of storage elements in a memory that has been exposed to IR reflow and that have not been reprogrammed. Data points indicated as crossed lines represent groups of storage elements in a memory that has not been exposed to IR reflow (or after reprogramming in a memory that has been exposed to IR reflow).

The memory may be a single level cell (SLC) flash memory or a multi-level cell (MLC) flash memory that stores two or more bits per storage element. For example, in a two-bits-per-storage-element, each cell is in one of four states: Er, A, B, or C. The four states can be represented in binary form (bits) of two logical pages: upper logical page and lower logical page. An upper logical page may be read by sensing cells using the read threshold voltage between the Er state and state A (the Er-A threshold) and using the read threshold voltage between state B and state C (the B-C threshold). A lower logical page may be read by sensing cells using the read threshold voltage between state A and state B (the A-B threshold). The upper logical page and the lower logical page may be independently decoded at the ECC engine 122 of FIG. 1 to determine corresponding values of the error metric 128 (illustrated as "Upper BER" and "Lower BER," respectively).

Data points corresponding to values of the Er-A threshold and Upper BER for a wordline are grouped into a first cluster 202 (IR reflow) and a second cluster 204 (no IR reflow). The first cluster 202 and the second cluster 204 do not overlap, and a first determinant function 206 that separates the first cluster 202 from the second cluster 204 is illustrated as a line. The first determinant function 206 may have the form y=Ax+B, where y is the error metric, x is the threshold voltage, and A and B may be empirically determined values.

Data points corresponding to values of the A-B threshold and Lower BER for a wordline are grouped into a third cluster 212 (IR reflow) and a fourth cluster 214 (no IR reflow). The third cluster 212 and the fourth cluster 214 do not overlap, and a second determinant function 216 separates the third cluster 212 from the fourth cluster 214.

Data points corresponding to values of the B-C threshold and Upper BER for a wordline are grouped into a fifth cluster 222 (IR reflow) and a sixth cluster 224 (no IR reflow). The fifth cluster 222 and the sixth cluster 224 do not overlap, and a third determinant function 226 separates the fifth cluster 222 from the sixth cluster 224.

As illustrated in FIG. 2, a determination may be made whether a memory exhibits effects of IR reflow by determining a threshold voltage 162 and an error metric 128 for a group of storage elements and comparing the data point corresponding to the determined values to the applicable determinant function 206, 216, or 226. For example, the ECC engine 122 may generate a fail bit count (FBC) for an ECC page. The fail bit count can be converted to a BER according to y=log 10(FBC/(ECC page size)). The comparator 154 of FIG. 1 may determine whether y>Ax+B to determine whether the ECC page exhibits data corruption corresponding to an IR reflow event.

In some embodiments, each logical page of a physical page may be processed by the corrupting event recovery engine 150 to determine whether a recovery process is to be performed. In the example of FIG. 2, processing each logical page of a physical page results in three data points in the upper clusters 202, 212, and 222 or three data points in the lower clusters 204, 214, and 224. However, complexity and processing load may be reduced by using a single logical page to determine whether an effect of IR reflow is present.

Figure 3:
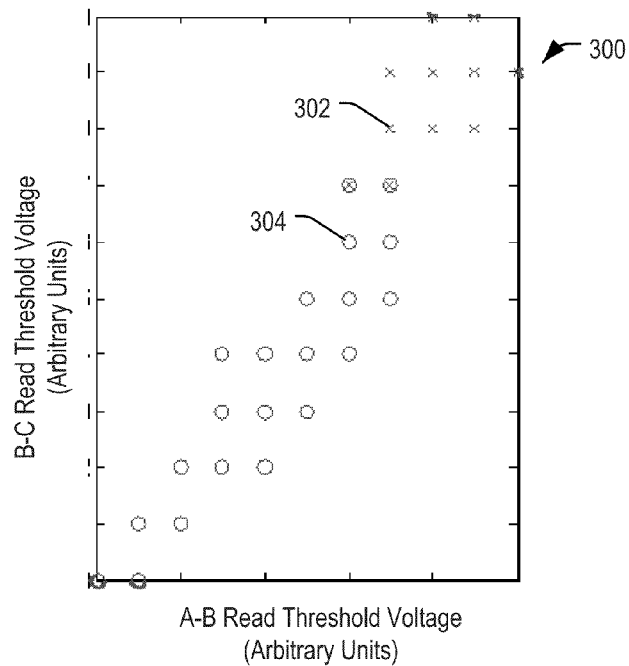
FIG. 3 is a diagram illustrating an example of relationships between read threshold voltages corresponding to corrupted preloaded data and non-corrupted preloaded data.

FIG. 3 illustrates a particular embodiment of a graph 300 showing examples of A-B read threshold voltages and B-C read threshold voltages for groups of storage elements as determined by the read threshold voltage engine 160 of FIG. 1. Data points indicated as crossed lines, such as a first representative data point 302, represent groups of storage elements in a memory that have not been exposed to IR reflow (or after reprogramming in a memory that has been exposed to IR reflow). Data points indicated as circles, such as a first representative data point 304, represent groups of storage elements in a memory that have been exposed to IR reflow and that have not been reprogrammed.

The graph 300 illustrates that values of A-B read threshold voltages and B-C read threshold voltages are at least partially correlated. As a result, an implementation of the controller 120 of FIG. 1 may include one or more tables storing information associating values of A-B read threshold voltages with B-C read threshold voltages so that the read threshold voltage engine 160 may determine a single read threshold voltage (e.g., an A-B read threshold voltage) and a corresponding value of another read threshold voltage (e.g., the B-C read threshold voltage) may be selected from the table. Although the graph 300 illustrates values of A-B read threshold voltages and B-C read threshold voltages, other graphs may be used to determine correlations between other pairs of read threshold voltages, such as values of Er-A read threshold voltages and A-B read threshold voltages, so that multiple threshold voltages may be estimated based on a single read threshold voltage 162 generated by the read threshold voltage engine 160.

Figure 4:
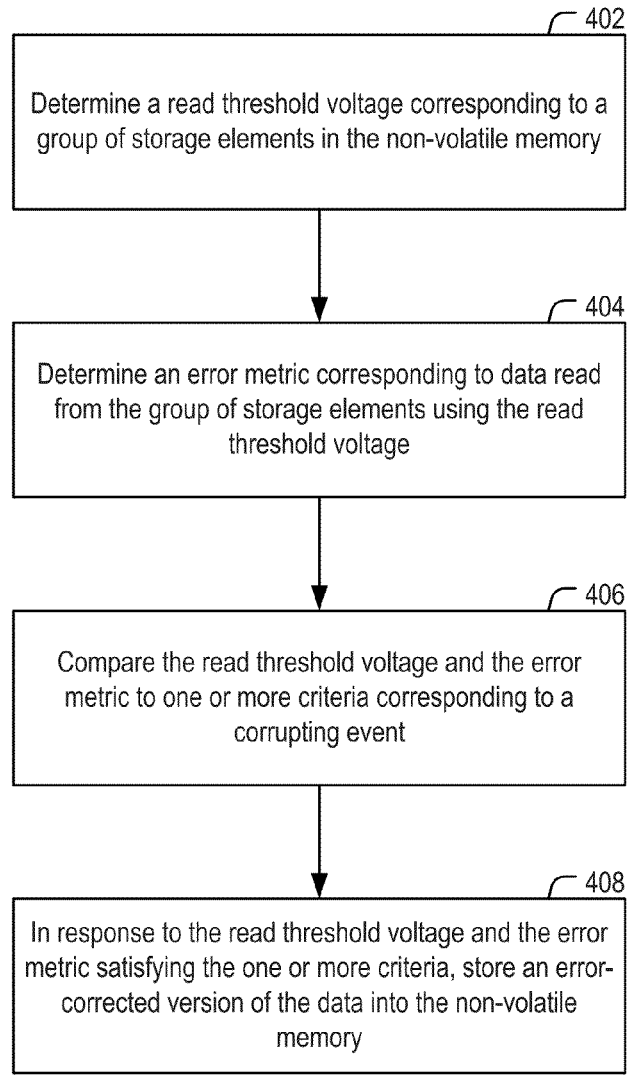
FIG. 4 is a flow diagram illustrating a particular embodiment of a method of detecting an effect of a corrupting event on preloaded data.

FIG. 4 illustrates a particular embodiment of a method 400 of detecting an effect of a corrupting event in a non-volatile memory. The method 400 may be performed in a data storage device that includes a controller and a non-volatile memory, such as the data storage device 102 of FIG. 1.

A read threshold voltage corresponding to a group of storage elements in the non-volatile memory is determined, at 402. The group of storage elements may store preloaded data, such as the preloaded data 114-116 of FIG. 1. For example, the read threshold voltage may be the read threshold voltage 162 that is generated by the read threshold voltage engine 160 of FIG. 1.

An error metric corresponding to data read from the group of storage elements using the read threshold voltage is determined, at 404. For example, the read threshold voltage 162 of FIG. 1 may be used to read data from the group of storage elements (e.g., the group 172 of FIG. 1). To illustrate, the read threshold voltage may be used to read data in a single sensing operation, such as the A-B threshold that is used to read the lower logical page of the 2-bit per cell MLC memory described with respect to FIG. 2. Alternatively, the read threshold voltage may be used as part of multiple sensing operations, such as sensing operations for the Er-A threshold or the B-C threshold that are used to read the upper logical page of the 2-bit per cell MLC memory described with respect to FIG. 2. The read data may be provided to the ECC engine 122 of FIG. 1 to determine or to estimate a count of bit errors or a bit error rate.

The read threshold voltage and the error metric are compared to one or more criteria corresponding to a corrupting event, at 406. For example, the corrupting event may correspond to an infrared reflow process. The one or more criteria may include a discriminant function, such as one or more of the discriminant functions 206, 216, or 226 of FIG. 2.

Determining the read threshold and the error metric may be performed in response to a power-up of the controller, such as during a recovery process that is performed by the controller upon power-up. For example, the corrupting event recovery engine 150 of FIG. 1 may determine a value of the recovery process indicator 140, and the read threshold voltage 162 and the error metric 128 may be determined in response to the recovery process indicator 140 indicating that a recovery process is not complete. As another example, the corrupting event recovery engine 150 of FIG. 1 may compare the count of write/erase cycles 144 of the non-volatile memory 104 to a threshold, and the read threshold voltage 162 and the error metric 128 may be determined in response to the count 144 being less than the threshold.

In response to the read threshold voltage and the error metric satisfying the one or more criteria corresponding to the corrupting event, the method 400 may include storing an error-corrected version of the data into the non-volatile memory, at 408. To illustrate, the corrupting event recovery engine 150 of FIG. 1 may schedule reprogramming of each of the groups 170-174 that contains preloaded data and may enter a reprogramming/refresh mode, such as described with respect to FIG. 1.

The recovery process may be performed on each group of storage elements that stores preloaded data in the non-volatile memory. For example, the corrupting event recovery engine 150 of FIG. 1 may access the preloaded content indicators 146 to determine which of the groups 170-174 store preloaded content and may schedule performance of the recovery process on each of the groups of storage elements determined to store preloaded data. In response to the recovery process being performed on the groups of storage elements that store the preloaded data, a recovery process indicator, such as the recovery process indicator 140, may be set to a value that indicates that the recovery process is complete.

By comparing whether the read threshold voltage and the error metric satisfy the one or more criteria, the method enables a controller to detect effects of a corrupting event (e.g., an IR reflow) and to initiate remedial events to correct corrupted data in the memory.

Although various components depicted herein are illustrated as block components and described in general terms, such components may include one or more microprocessors, state machines, or other circuits configured to enable the data corrupting event recovery engine 150 of FIG. 1 to detect effects of a corrupting event, such as IR reflow, and to initiate remedial action to recover corrupted data. For example, the data corrupting event recovery engine 150 may represent physical components, such as latches, exclusive-OR circuits, hardware controllers, state machines, logic circuits, or other structures, to enable the data corrupting event recovery engine 150 to receive the one or more read threshold voltages 162 for a particular group of storage elements and to receive the error metric 128 corresponding to the particular group of storage elements that is read using the one or more read threshold voltages 162. The physical components may further be configured to enable the data corrupting event recovery engine 150 to compare the error metric 128 and the one or more read threshold voltages 162 to the one or more criteria 154, such as described with respect to the discriminant functions 206, 216, and 226 of FIG. 2.

The data corrupting event recovery engine 150 may be implemented using a microprocessor or microcontroller programmed to compare the error metric and the read threshold voltage(s) to one or more criteria, and to perform one or more recovery operations based on the comparison, such as by storing an error corrected version of preloaded data to the group of storage elements and updating one or more status indicators (e.g., the recovery process status indicators 142 of FIG. 1). In a particular embodiment, the data corrupting event recovery engine 150 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device including a controller and a non-volatile memory, performing:
determining a read threshold voltage corresponding to a group of storage elements in the non-volatile memory;
determining an error metric corresponding to data read from the group of storage elements using the read threshold voltage; and
comparing the read threshold voltage and the error metric to one or more criteria corresponding to a corrupting event.

2. The method of claim 1, wherein the corrupting event is an infrared reflow process.

3. The method of claim 1, wherein determining the read threshold voltage and the error metric are performed in response to a power-up of the controller.

4. The method of claim 3, further comprising determining a value of a recovery process indicator, and wherein the read threshold voltage and the error metric are determined in response to the recovery process indicator indicating that a recovery process is not complete.

5. The method of claim 3, further comprising comparing a count of write/erase cycles of the non-volatile memory to a threshold, and wherein the read threshold voltage and the error metric are determined in response to the count being less than the threshold.

6. The method of claim 1, wherein the group of storage elements stores preloaded data.

7. The method of claim 1, wherein the read threshold voltage and the error metric are determined during a recovery process performed by the controller upon power-up, and further comprising:
in response to the read threshold voltage and the error metric satisfying the one or more criteria, storing an error-corrected version of the data into the non-volatile memory.

8. The method of claim 7, wherein the recovery process is performed on each group of storage elements that stores preloaded data in the non-volatile memory.

9. The method of claim 7, further comprising, in response to the recovery process being performed on each group of storage elements that stores preloaded data in the non-volatile memory, setting a recovery process indicator to a value that indicates that the recovery process is complete.

10. The method of claim 1, wherein the one or more criteria includes a discriminant function.

11. The method of claim 10, wherein comparing the read threshold voltage and the error metric to the one or more criteria includes comparing the error metric to a value of the discriminant function at the read threshold voltage.

12. The method of claim 1, wherein the one or more criteria indicate effects of the corrupting event.

13. A data storage device comprising:
a non-volatile memory; and
a controller coupled to the non-volatile memory, wherein the controller is configured to determine a read threshold voltage corresponding to a group of storage elements in the non-volatile memory and to determine an error metric corresponding to data read from the group of storage elements using the read threshold voltage, and wherein the controller is further configured to compare the read threshold voltage and the error metric to one or more criteria corresponding to a corrupting event.

14. The data storage device of claim 13, wherein the corrupting event is an infrared reflow process.

15. The data storage device of claim 13, wherein the controller is configured to determine the read threshold voltage and the error metric in response to a power-up of the controller.

16. The data storage device of claim 15, wherein the controller is configured to determine a value of a recovery process indicator to determine the read threshold voltage and the error metric in response to the recovery process indicator indicating that a recovery process is not complete.

17. The data storage device of claim 16, wherein the controller is configured to compare a count of write/erase cycles of the non-volatile memory to a threshold and to determine the read threshold voltage and the error metric in response to the count being less than the threshold.

18. The data storage device of claim 13, wherein the group of storage elements stores preloaded data.

19. The data storage device of claim 13, wherein the controller is configured to determine the read threshold voltage and the error metric during a recovery process performed by the controller upon power-up, and wherein in response to the read threshold voltage and the error metric satisfying the one or more criteria, the controller is configured to store an error-corrected version of the data into the non-volatile memory.

20. The data storage device of claim 19, wherein the controller is configured to perform the recovery process on each group of storage elements that stores preloaded data in the non-volatile memory.

21. The data storage device of claim 19, wherein the controller is further configured, in response to the recovery process being performed on each group of storage elements that stores preloaded data in the non-volatile memory, to set a recovery process indicator to a value that indicates that the recovery process is complete.

22. The data storage device of claim 13, wherein the one or more criteria includes a discriminant function.

* * * * *